(12) United States Patent
Kanoh et al.

(10) Patent No.: US 8,271,222 B2
(45) Date of Patent: Sep. 18, 2012

(54) SAMPLING APPARATUS AND SAMPLING METHOD

(75) Inventors: Eiji Kanoh, Tokyo (JP); Takayuki Akita, Tokyo (JP); Masayuki Kawabata, Tokyo (JP)

(73) Assignee: Advantest Corporation, Tokyo (JP)

( * ) Notice: Subject to any disclaimer, the term of this patent is extended or adjusted under 35 U.S.C. 154(b) by 1135 days.

(21) Appl. No.: 12/136,064

(22) Filed: Jun. 10, 2008

(65) Prior Publication Data

US 2009/0306917 A1 Dec. 10, 2009

(51) Int. Cl.
*G01R 29/02* (2006.01)
*G01R 29/00* (2006.01)

(52) U.S. Cl. .............. 702/79; 702/80; 702/81; 702/82

(58) Field of Classification Search ............ 702/79–101, 702/121–123, 179, 188, 189
See application file for complete search history.

(56) References Cited

U.S. PATENT DOCUMENTS

2007/0217356 A1* 9/2007 Kanno et al. ................. 370/328

OTHER PUBLICATIONS

Arthur Kohlenberg, "Exact Interpolation of Band-Limited Functions", Journal of Applied Physics, vol. 24, No. 12, Dec. 1953.
Takuro Kida, et al., "Relations Between the Possibility of Restoration of Bandpass Type Band Limited Waves by Interpolation and Arrangement of Sampling Points", 1984.
Kuroda Tohru, Kida Takuro, "Relations between the possibility of restoration of bandpass-type band-limited waves by interpolation and arrangement of sampling points", Denki Tsushin Gakkai Ronbunsho, vol. J67-A, pp. 717-724, 1984.

* cited by examiner

*Primary Examiner* — Phuong Huynh
(74) *Attorney, Agent, or Firm* — Jianq Chyun IP Office

(57) ABSTRACT

Provided is a sampling apparatus that samples a signal under measurement, including a sample processing section that outputs sample data obtained by sampling the signal under measurement with a sampling timing at non-uniform intervals obtained by thinning a reference clock, a storage section that stores the sample data, and a waveform generating section that generates a waveform of the signal under measurement based on the sample data read from the storage section. The sample processing section includes a sampler that samples the signal under measurement in synchronization with the reference clock and a data thinning section that thins the sample data output by the sampler and outputs this thinned data as sample data with the sampling timing at non-uniform intervals.

19 Claims, 12 Drawing Sheets

| FREQUENCY SHIFT AMOUNT ($\times \frac{1}{2}fs$) | 0° | 60° | 180° | 240° | |
|---|---|---|---|---|---|
| −6 [−fs] | 0° | 0° | 0° | 0° | → CANCEL OUT |
| −5 [−0.5fs] | 0° | 60° | 180° | 240° | |
| −4 [0] | 0° | 120° | 0° | 120° | → CANCEL OUT |
| −3 [0.5fs] | 0° | 180° | 180° | 0° | → CANCEL OUT |
| −2 [fs] | 0° | 240° | 0° | 240° | → CANCEL OUT |
| −1 [1.5fs] | 0° | 300° | 180° | 120° | |
| 0 [2fs] | 0° | 0° | 0° | 0° | → CANCEL OUT |
| 1 [2.5fs] | 0° | 60° | 180° | 240° | |
| 2 [3fs] | 0° | 120° | 0° | 120° | → CANCEL OUT |
| 3 [3.5fs] | 0° | 180° | 180° | 0° | → CANCEL OUT |
| 4 [4fs] | 0° | 240° | 0° | 240° | → CANCEL OUT |
| 5 [4.5fs] | 0° | 300° | 180° | 120° | |
| 6 [5fs] | 0° | 0° | 0° | 0° | → CANCEL OUT |

*FIG. 6*

SAMPLING APPARATUS AND SAMPLING METHOD

BACKGROUND

1. Technical Field

The present invention relates to a sampling apparatus and a sampling method. In particular, the present invention relates to a sampling apparatus and a sampling method for sampling a signal under measurement.

2. Related Art

A conventional sampling method, known as $2^{nd}$ order sampling, uses two sampling timings having identical sampling frequencies and different phases, as shown in, for example, Arthur Kohlenberg, "Exact Interpolation of Band-limited Functions," Journal of Applied Physics, Vol. 24, No. 12, December 1953. Sampling at N target points in each sampling cycle is also proposed, as in, for example, Kuroda Tohru, Kida Takuro, "Relations between the possibility of restoration of bandpass-type band-limited waves by interpolation and arrangement of sampling points", Denki Tsushin Gakkai Ronbunsho, Vol J67-A, pp. 717-724, 1984.

With these conventional methods, N non-uniform sampling timings are set to one cycle. The continuous time function of the signal under measurement is then obtained by performing a convolution operation between sample data obtained by repeatedly sampling the signal under measurement over a plurality of cycles and the sampling function derived from the phase of each sampling timing. The discrete-time waveform data is obtained by sequentially substituting the discrete-time having the target time intervals into the continuous time function.

Since conventional methods require derivation of the sampling function and sequential calculation of the values of the waveform data by substituting time into the sampling function, the signal processing becomes complicated.

An interleave method is known for acquiring a signal having a high band by alternately and uniformly deviating sampling timings of a plurality of AD converters. With this method, however, the data amount acquired per unit time increases relative to the number of AD converters, and therefore the circuit size of the memory circuit at the final stage must be increased.

Another method is known for acquiring a signal having a high band by obtaining a signal that is down-converted by a mixer. With this method, however, a circuit such as a local oscillator and a filter must be provided, thereby increasing the circuit size.

Undersampling is yet another method for acquiring a signal having a high band. Undersampling, however, imposes a limit on the acquirable band. For example, if there is one AD converter, the acquirable signal is limited to having a bandwidth less than fs/2 and cannot cross multiples of (fs/2), where fs is the sampling frequency. Even if two AD converters perform undersampling through interleaving, a signal crossing a multiple of (fs/2) cannot be acquired.

CITED DOCUMENTS

Arthur Kohlenberg, "Exact Interpolation of Band-limited Functions," Journal of Applied Physics, Vol. 24, No. 12, December 1953.

Kuroda Tohru, Kida Takuro, "Relations between the possibility of restoration of bandpass-type band-limited waves by interpolation and arrangement of sampling points", Denki Tsushin Gakkai Ronbunsho, Vol J67-A, pp. 717-724, 1984.

SUMMARY

Therefore, it is an object of an aspect of the innovations herein to provide a sampling apparatus and a sampling method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary sampling apparatus may include a sampling apparatus that samples a signal under measurement, including a sample processing section that outputs sample data obtained by sampling the signal under measurement with a sampling timing at non-uniform intervals obtained by thinning a reference clock, a storage section that stores the sample data, and a waveform generating section that generates a waveform of the signal under measurement based on the sample data read from the storage section.

According to a second aspect related to the innovations herein, one exemplary sampling method may include a method for sampling a signal under measurement, including the steps of outputting sample data obtained by sampling the signal under measurement with a sampling timing at non-uniform intervals obtained by thinning a reference clock, storing the sample data, and generating a waveform of the signal under measurement based on the sample data read from the storage section.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 6 shows frequency bands in which the replicas are canceled out by the sample processing section 115 according to the present embodiment.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
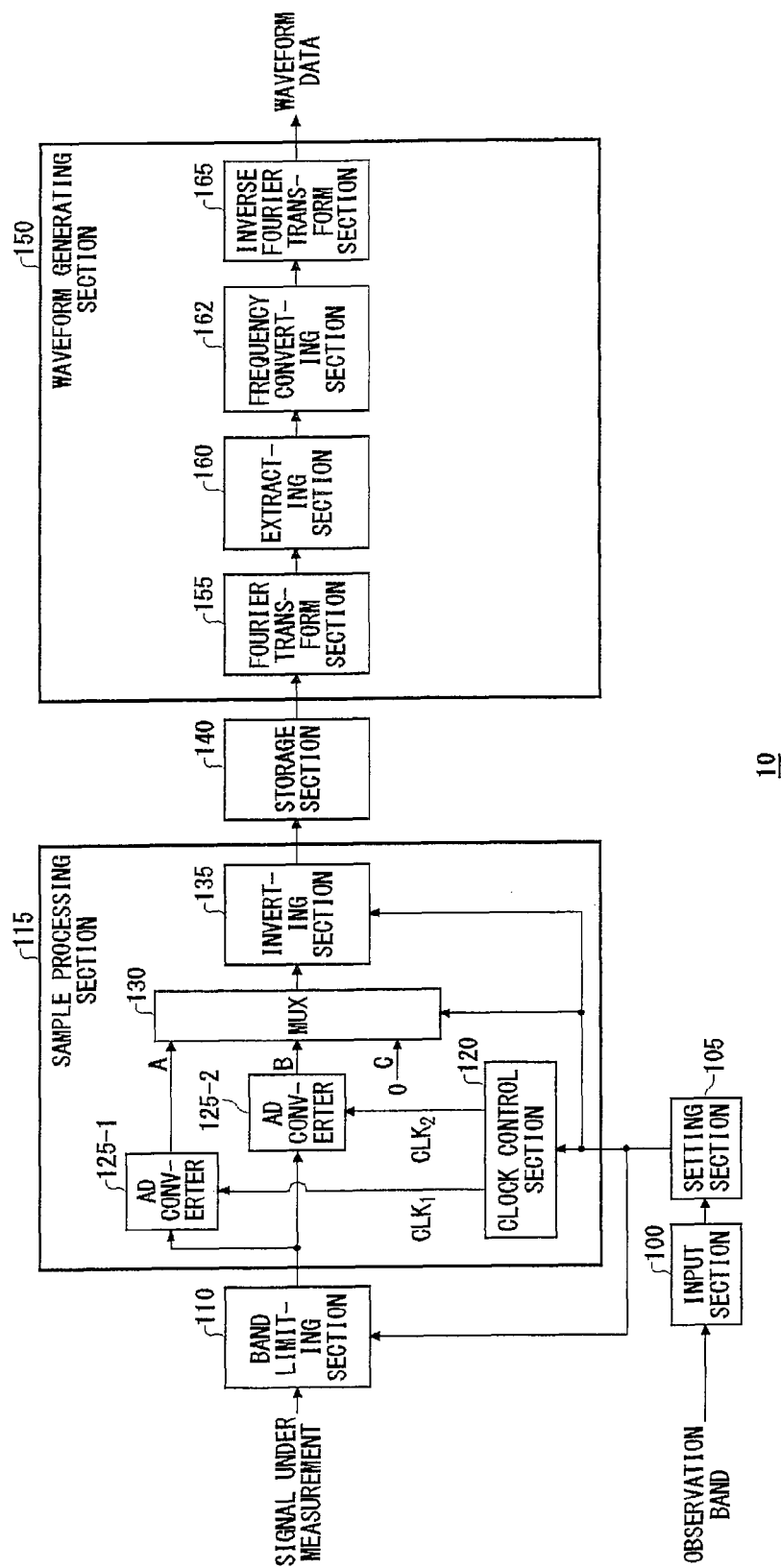
FIG. 1 shows a configuration of a sampling apparatus 10 according to the present embodiment.

FIG. 1 shows a configuration of a sampling apparatus 10 according to the present embodiment. The sampling apparatus 10 samples a signal under measurement to generate waveform data of the signal under measurement. More specifically, the sampling apparatus 10 samples the signal under measurement by repeatedly performing the sampling process at a plurality of sampling phases at non-uniform intervals, for each sampling repetition cycle. Here, the sampling apparatus 10 selects each sampling phase to be suitable for the frequency domain of the signal under measurement, and/or changes the sign of the sampled data as appropriate. In this way, the sampling apparatus 10 can cancel out replicas that are not observation targets from among the replicas of the signal under measurement and the replicas of the negative frequency component of the signal under measurement caused by the sampling. Therefore, the sampling apparatus 10 can cause the replicas being observed to remain in the sampled data sequence, and can then generate waveform data of the signal under measurement based on these replicas.

The sampling apparatus 10 is provided with an input section 100, a setting section 105, a band limiting section 110, a sample processing section 115, a storage section 140, and a waveform generating section 150. The input section 100 receives the observation band of the signal under measurement as input. Based on the input observation band, the setting section 105 sets a passable frequency band for the band limiting section 110, sets a plurality of sampling phases for a clock control section 120 in the sample processing section 115, sets a multiplex method of the sampled data for a multiplexer 130 in the sample processing section 115, and sets information for an inverting section 135 in the sample processing section 115 that indicates the sampling phases at which the inverting section inverts the values of the signal under measurement, from among the plurality of sampling phases.

The band limiting section 110 receives the signal under measurement, which is an analog signal, and allows a frequency component of a passable frequency domain designated by the setting section 105 to pass through to the sample processing section 115. Frequency components that are outside of this passable frequency domain are damped or blocked. If the frequency domain of the signal under measurement is determined in advance, the band limiting section 110 may be omitted from the configuration of the sampling apparatus 10.

The sample processing section 115 receives the signal under measurement having a frequency domain that is limited by the band limiting section 110 to be within the observation band. The sample processing section 115 outputs sample data obtained by sampling the received signal under measurement at non-uniform intervals. In this way, the sample processing section 115 cancels out unnecessary replicas in the signal under measurement caused by the sampling, and outputs sample data in which the target replicas remain. The sample processing section 115 includes the clock control section 120, AD converters 125-1, 125-2, the multiplexer 130, and the inverting section 135.

The clock control section 120 receives a setting from the setting section 105 to generate a plurality of sampling clocks that repeatedly sample the signal under measurement in each cycle at a plurality of sampling phases at non-uniform intervals. The plurality of AD converters 125 are examples of sampling sections, and sample the signal under measurement with each of the plurality of sampling clocks. Each AD converter 125 is an example of a sampler. The AD converters are disposed to correspond respectively to a plurality of sampling clocks, and output digital sample data obtained by sampling the analog signal under measurement at corresponding sampling clocks, for each sampling clock. In the present embodiment, the sample processing section 115 includes two AD converters 125, but the sample processing section 115 may include three or more AD converters 125.

The multiplexer 130 switches between selecting the sample data from the plurality of AD converters 125 and the constant 0, and multiplexes the resulting data to output multiplexed sample data. The inverting section 135 receives a setting from the setting section 105 to invert the sign of the sample data values, which are values of the signal under measurement sampled at least one sampling phase from among the plurality of sampling phases, as necessary. Depending on the setting, the inverting section 135 need not invert the sign of any of the data values. The inverting section 135 may be omitted from the configuration of the sampling apparatus 10, in which case the sampling apparatus 10 may cancel out the unnecessary replicas by selecting sampling phases without inverting the signs of the data values.

The storage section 140 stores the sample data output by the sample processing section 115. For example, the storage section 140 includes a memory onto which the storage section 140 sequentially stores, at consecutive addresses, a data sequence of the sample data output sequentially by the sample processing section 115. Instead of this example or in addition to this example, the storage section 140 may be divided to correspond to each AD converter 125, and the storage section 140 may temporarily store the sample data output by each AD converter 125. The storage section 140 may be omitted from the configuration of the sampling apparatus 10.

The waveform generating section 150 generates waveform data of the signal under measurement based on the sample data read from the storage section 140. More specifically, the waveform generating section 150 generates the waveform data of the signal under measurement based on the target replicas received from the sample processing section 115. The waveform generating section 150 includes a Fourier transform section 155, an extracting section 160, a frequency converting section 162, and an inverse Fourier transform section 165.

The Fourier transform section 155 reads the sample data, which is the output signal of the inverting section 135, from the storage section 140 and Fourier transforms this data into the frequency domain. The extracting section 160 extracts the target replicas from the frequency domain. The frequency converting section 162 generates the signal under measurement in the frequency domain, based on the target replicas in the frequency domain. The inverse Fourier transform section 165 inverse Fourier transforms the signal under measurement in the generated frequency domain to generate waveform data of the signal under measurement in the time domain.

Figure 2:
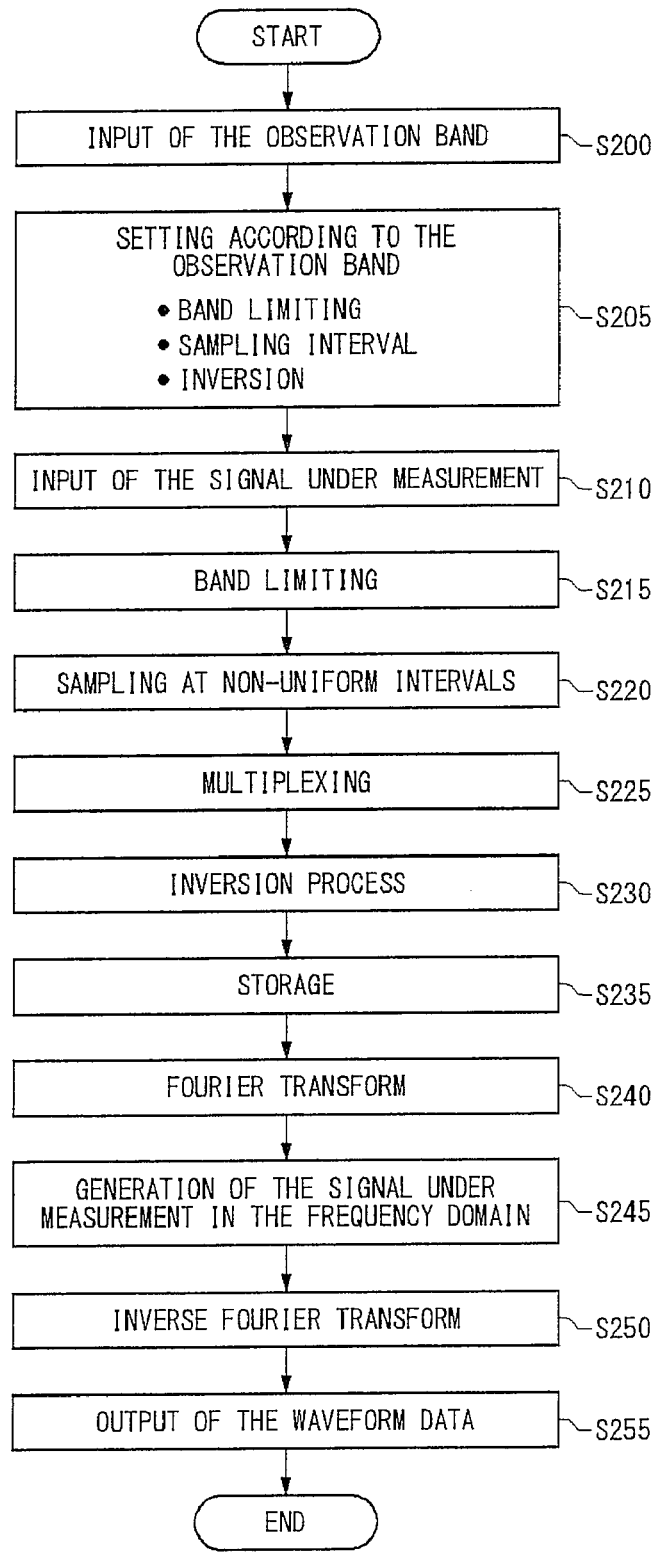
FIG. 2 shows the performance of the sampling apparatus 10 according to the present embodiment.

FIG. 2 shows the performance of the sampling apparatus 10 according to the present embodiment.

First, the input section 100 receives the observation band of the signal under measurement as input (S200). Here, a user may input the observation band of the signal under measurement into the input section 100. If the sampling apparatus 10 is capable of sampling with a broad spectrum, such as by sweeping, which involves sampling the signal under measurement while alternating the observation band, the sampling apparatus 10 may receive designation for a plurality of observation bands for each measurement from the control section in the sampling apparatus 10.

Next, the setting section 105 receives the observation band from the input section 100 and provides a setting for the band limiting section 110, the clock control section 120, the multiplexer 130, and the inverting section 135 according to the observation band (S205). The setting section 105 sets the observation band to be the pass band of the band limiting section 110.

The setting section 105 sets, for the clock control section 120, a plurality of sampling phases at determined non-uniform intervals such that replicas that are not observation targets cancel each other out, from among the replicas of the negative frequency component and the replicas of the signal under measurement in the observation band having a bandwidth that is less than that of the sampling band. Here, the sampling band serves to generate the waveform data of the signal under measurement. Therefore, the sampling band is a frequency band from which are extracted the replicas of the portion of the signal under measurement that does not interfere with other replicas, namely the positive frequency component or the negative frequency component of the signal under measurement. This sampling band may have a frequency-place that is lower than, or no greater than, that of the observation band. The sampling band may have a frequency-place that is fixed regardless of the observation band, or may have a frequency-place that can change according to the observation band. In the present embodiment, where four sampling phases are used, for example, the sampling band is a frequency band from 0 to less than double the sampling repetition frequency or from the sampling repetition frequency to triple the sampling repetition frequency.

The setting section 105 sets the order in which the multiplexer 130 selects the constant 0 and the sample data output from each AD converter 125. The setting section 105 sets, for each sampling phase, whether the inverting section inverts the signs of the values of the signal under measurement sampled at each sampling phase, based on the observation band. The setting section 105 may instead set the inverting section to invert the sign of the values of the signal under measurement at all of the sampling phases, based on the observation band. In this way, the inverting section 135 can cancel out the replicas in the sampling band that are not observation targets. The setting section 105 may cancel out all of the replicas in the sampling band that are not observation targets by a combination of selecting the sampling phases and inverting or not inverting the signs of the sampled values.

Next, the sampling apparatus 10 begins the measurement by inputting the signal under measurement (S210).

Figure 3:
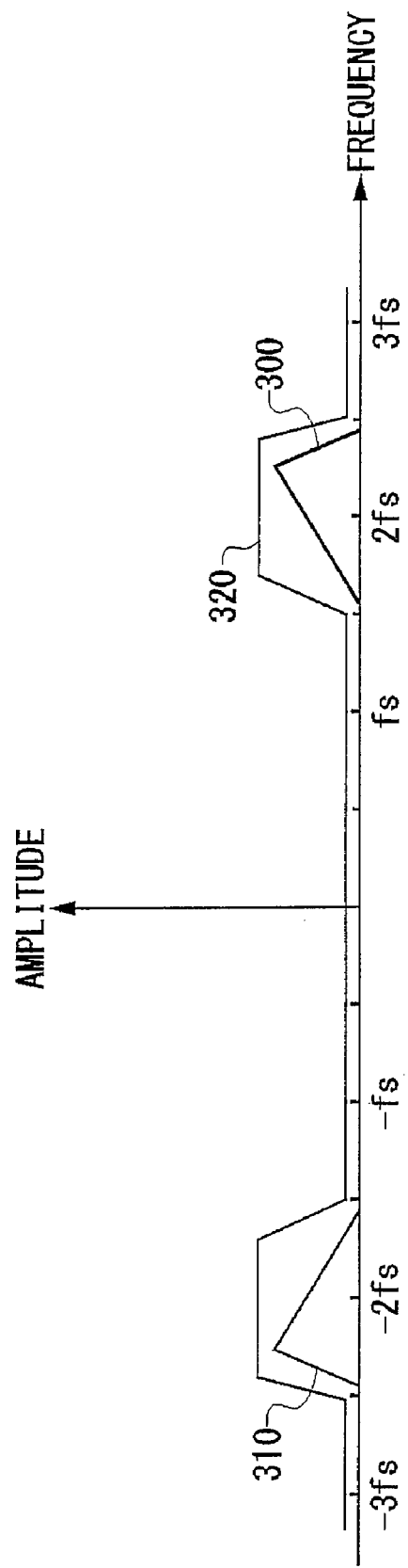
FIG. 3 shows a pass band of the band limiting section 110 according to the present embodiment.

The band limiting section 110 allows the frequency components of the observation band in the signal under measurement to pass through and damps or restricts the frequency components that are outside of the observation band. FIG. 3 shows an example where the pass band 320 is set in the band limiting section 110 to be a frequency band that is from 1.5 times to 2.5 times the sampling clock frequency fs, and therefore the band limiting section 110 allows a signal under measurement to pass that is centered on a frequency that is double the sampling clock frequency fs. By allowing this signal under measurement 300 to pass and sampling the signal under measurement 300 at a later stage, a negative frequency component 310 is generated, which is centered on a frequency axis of 0 and is symmetrical to the signal under measurement 300 on the negative frequency side.

The clock control section 120 and the AD converters 125-1, 125-2 sample the signal under measurement at a plurality of sampling phases at non-uniform intervals for each sampling repetition cycle (S220). More specifically, the clock control section 120 generates a plurality of sampling clocks having a plurality of phases at predetermined non-uniform intervals to cancel out the replicas that are not observation targets from among the replicas of the negative frequency component of the signal under measurement and replicas of the signal under measurement in the sampling band, for each sampling repetition cycle. The plurality of AD converters 125 sample the signal under measurement with each of the plurality of sampling clocks.

The multiplexer 130 multiplexes the constant 0 and the sample data output by each AD converter 125 in the order set by the setting section 105, and outputs the thus multiplexed data (S225). The inverting section 135 inverts the signs of the designated pieces of data in the sequence of sample data received from the multiplexer 130, according to the setting received from the setting section 105 (S230). The storage section 140 stores the sequence of sample data output by the sample processing section 115 (S235).

The Fourier transform section 155 Fourier transforms the sample data into the frequency domain (S240). The extracting section 160 extracts the target replicas in the frequency domain, and the frequency converting section 162 generates the signal under measurement in the frequency domain based on the target replicas in the frequency domain (S245). Here, the extracting section 160 extracts the target replicas by eliminating the frequency components outside of the sampling band from among the components at each frequency obtained as a result of the Fourier transform of the sample data. The frequency converting section 162 reproduces the frequency components of the signal under measurement by frequency-shifting the target replicas to the observation band.

The inverse Fourier transform section 165 inverse Fourier transforms the frequency components of the signal under measurement generated by the frequency converting section 162 to obtain the digital waveform data of the signal under measurement (S250). The inverse Fourier transform section 165 then outputs the waveform data of the signal under measurement (S255).

Figure 4:
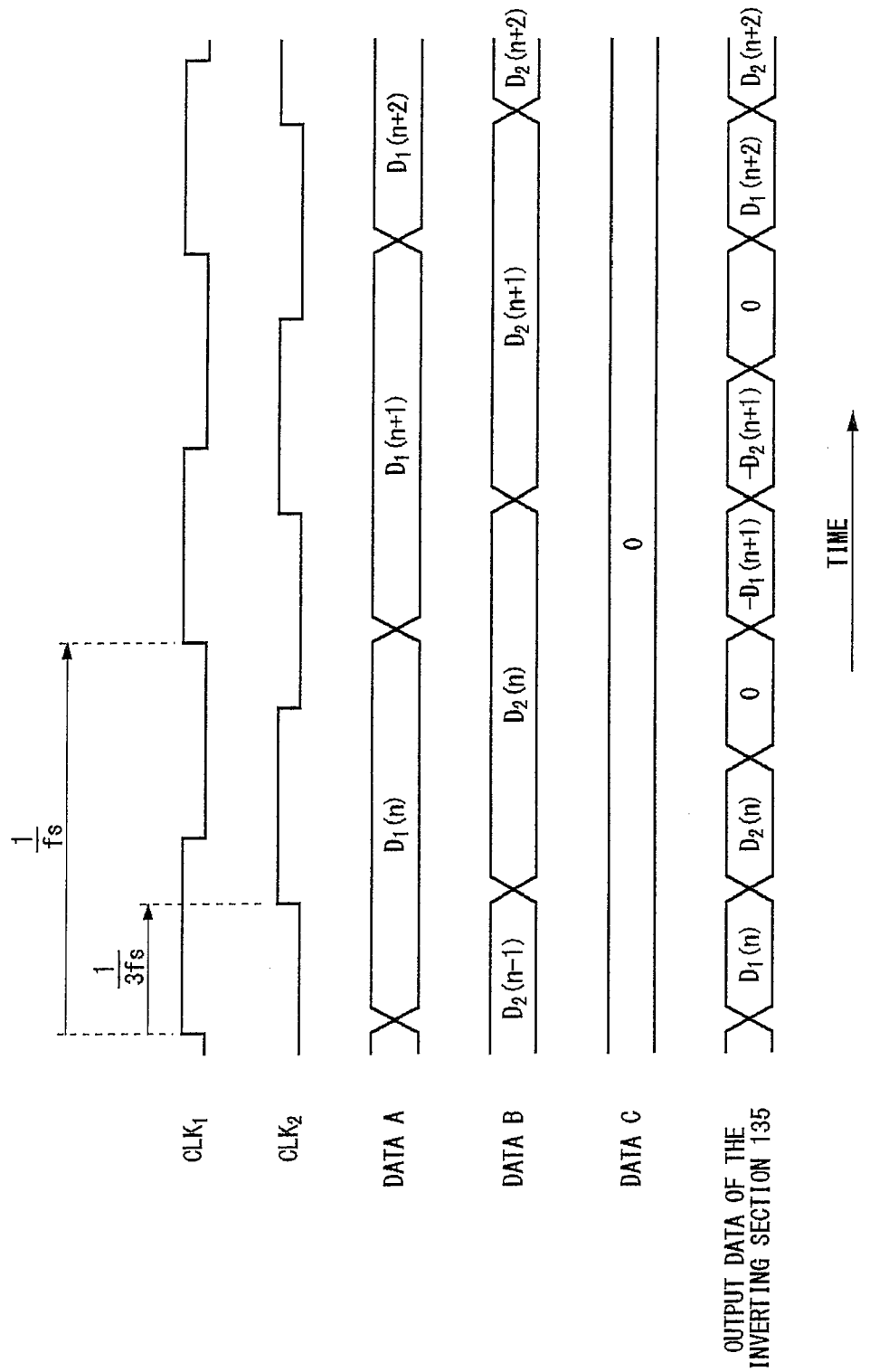
FIG. 4 shows a performance timing of the sample processing section 115 according to the present embodiment.

FIG. 4 shows a performance timing of the sample processing section 115 according to the present embodiment.

The clock control section 120 outputs a sampling clock CLK1 having a frequency fs and a cycle 1/fs and a sampling clock CLK2 having a frequency fs and delayed by $1/(3fs)$ in relation to CLK1. The AD converter 125-1 samples the signal under measurement by AD converting the signal under measurement input via the band limiting section 110, according to the rising timing of CLK1. The AD converter 125-2 samples the signal under measurement by AD converting the signal under measurement input via the band limiting section 110, according to the rising timing of CLK2.

The multiplexer 130 outputs, for the first ⅓ of each cycle of the sampling clock, sample data D1($k$) which is output by the AD converter 125-1, where k is an integer. The multiplexer 130 outputs, for the second ⅓ of each cycle of the sampling clock, sample data D2($k$) which is output by the AD converter 125-2. The multiplexer 130 outputs the constant 0 for the final ⅓ of each cycle of the sampling clock. The inverting section 135 inverts every other set of sample data output by the AD converter 125-1 and the AD converter 125-2 to be negative. More specifically, the inverting section 135 outputs the sample data from the AD converter 125-1 and the AD converter 125-2 without inverting the sign thereof at a certain cycle of the sampling clock, and then outputs sample data having an inverted sign in the subsequent cycle of the sampling clock.

Through the process described above, the sample processing section 115 outputs the output data D1($k$) from the AD converter 125-1, the output data D2($k$) from the AD converter 125-2, and the constant 0 in the stated order within one cycle 1/fs of the signal under measurement 300 shown in FIG. 3. The sample processing section 115 then outputs, in the subsequent cycle of the 1/fs of the signal under measurement 300, sample data obtained by inverting the sign of D1($k$+1) and D2($k$+1).

Figure 5:
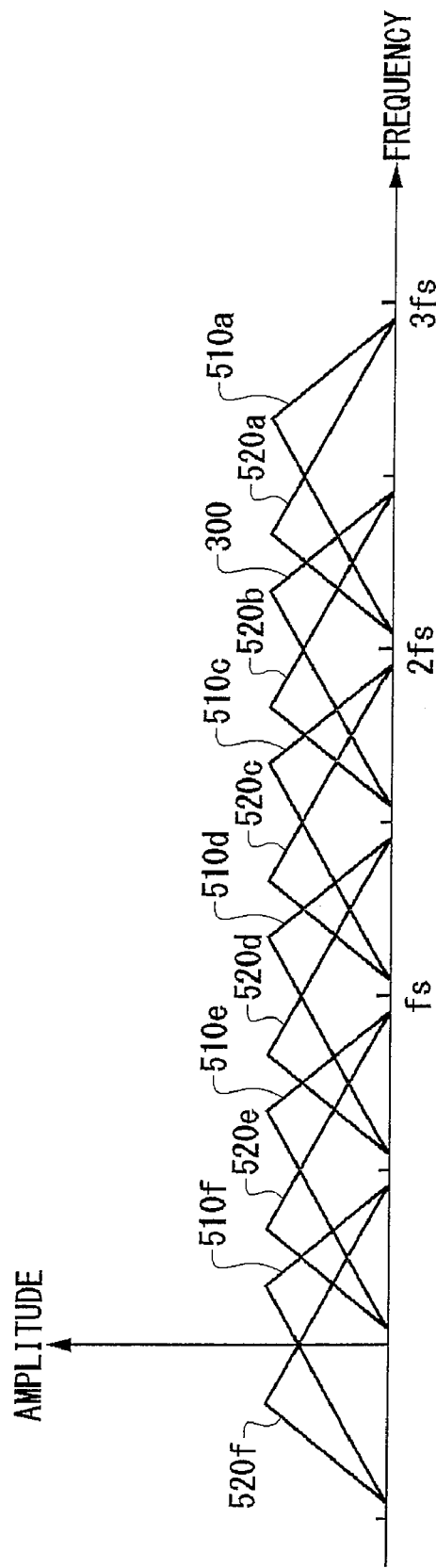
FIG. 5 shows replicas occurring in the signal under measurement sampled by the AD converter 125 according to the present embodiment.

FIG. 5 shows replicas generated in the signal under measurement sampled by the AD converter 125 according to the present embodiment. As described above, the inverting section 135 outputs sample data without inverting the signs thereof at a certain cycle in the sampling clock and then outputs sample data having inverted signs at the subsequent cycle. Accordingly, the inverting section 135 outputs the sample data D1($k$), D2($k$), 0, −D1 ($k$+1), and −D2($k$+1) and 0, for each sampling repetition cycle, where one sampling cycle corresponds to two cycles of the sampling clock, namely a cycle of 2/fs.

Here, the AD converters 125-1, 125-2 sample the signal under measurement with four sampling phases that are 0, 60, 180, and 240 degrees in relation to the sampling repetition cycle (referred to hereinafter as "the first, second, third, and fourth sampling phases," in the stated order) for each sampling repetition cycle 2/fs. The inverting section 135 inverts the signs of the values of the signal under measurement sampled at the sampling phases of 180 and 240 degrees, from among these four sampling phases. Here, one of the four sampling phases, for example, the sampling phase of 0 degrees, is used for uniform undersampling with the sampling repetition cycle 2/fs, which means that the sampling repetition frequency is (½)fs.

In this case, replicas 510$a$, 510$c$, 510$d$, 510$e$, 510$f$ (also known as "aliases") having frequency spectrums identical to the signal under measurement 300 occur at certain positions. These positions are found by frequency-shifting the signal under measurement 300 within the observation band from 1.5fs to 2.5 fs, which is the positive frequency component of the signal under measurement 300, by an integer multiple of the sampling repetition frequency (½)fs. Furthermore, replicas 520$a$ to 520$f$ having frequency spectrums identical to the negative frequency component 310 of the signal under measurement 300 occur at certain positions. These positions are found by frequency-shifting the negative frequency component 310 of the signal under measurement 300 within the frequency band from −1.5fs to −2.5 fs by an integer multiple of the sampling repetition frequency (½)fs. In this way, if a signal under measurement 300 that crosses integer multiples of (½)fs is sampled with a sampling repetition period (½)fs by the AD converters 125, the replicas 510 of the signal under measurement 300 undesirably overlap with the replicas 520 of the negative frequency component 310 of the signal under measurement 300 on the frequency axis, so that it becomes difficult to extract only one replica.

FIG. 6 shows frequency bands in which the replicas are canceled out by the sample processing section 115 according to the present embodiment. As described above, the sample processing section 115 of the present embodiment samples the signal under measurement at the first through fourth sampling phases for each sampling repetition cycle 2/(fs). Here, if the sample processing section 115 samples the signal under measurement 300 at a plurality of different sampling phases, the phase difference of the replicas occurring at positions found by frequency-shifting the replicas by k times the sampling repetition frequency, with the signal under measurement as a base, is equal to k times the phase difference in the sampling repetition cycle. Here, k is an integer. For example, if the sample processing section 115 samples the signal under measurement at two sampling phases having a phase difference of 60 degrees in the sampling repetition cycle, the replicas that are shifted to a higher frequency by the sampling repetition frequency have a phase difference of 60 degrees, the replicas that are shifted to a higher frequency by double the sampling repetition frequency have a phase difference of 120 degrees, and the replicas that are shifted to a higher frequency by triple the sampling repetition frequency have a phase difference of 180 degrees. Furthermore, the replicas that are shifted to a lower frequency by the sampling repetition frequency have a phase difference of −60 degrees, the replicas that are shifted to a lower frequency by the sampling repetition frequency have a phase difference of −120 degrees, and the replicas that are shifted to a lower frequency by the sampling repetition frequency have a phase difference of −180 degrees.

Accordingly, with the replicas 510 of the signal under measurement 300 sampled at the first sampling phase as a base, which is the sampling phase that is 0 degrees in relation to the sampling process repletion cycle, the replicas 510 of the signal under measurement 300 sampled at the second sampling phase have the signal under measurement 300 with a frequency centered on 2fs as a base, and have a phase difference that increases by 60 degrees for every shift of (½)fs to a higher frequency and decreases by 60 degrees for every shift of (½)fs to a lower frequency. In the same way, the replicas 510 of the signal under measurement 300 sampled at the third sampling phase have the signal under measurement 300 as a base, and have a phase difference that changes by 180 degrees for every shift of the sampling repetition frequency. The replicas 510 of the signal under measurement 300 sampled at the fourth sampling phase have the signal under measurement 300 as a base, and have a phase difference that changes by 240 degrees for every shift of the sampling repetition frequency.

Replicas having opposite phase differences, namely phase differences of 180 degrees, are then added together to cancel each other out. Since the data sampled at the third and fourth sampling phases has inverted signs, the four replicas centered on 0.5fs, which are 0, 180, 180, and 0 degrees, for example, cancel each other out. In the same way, the sets of four signals under measurement 300 or replicas 510 centered on each frequency shown in FIG. 6 that have "cancel" written next to them can cancel each other out.

Figure 7A:
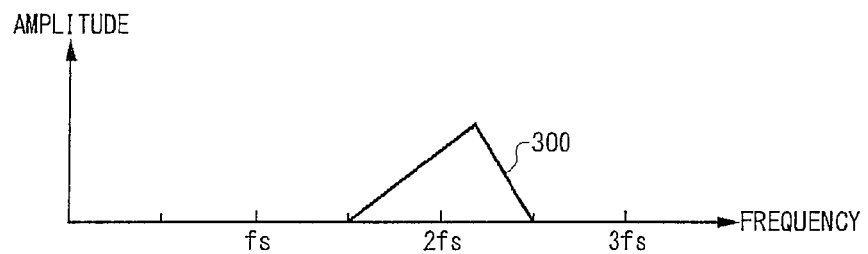
FIG. 7A shows a signal under measurement input into the sample processing section 115 of the present embodiment.
Figure 7B:
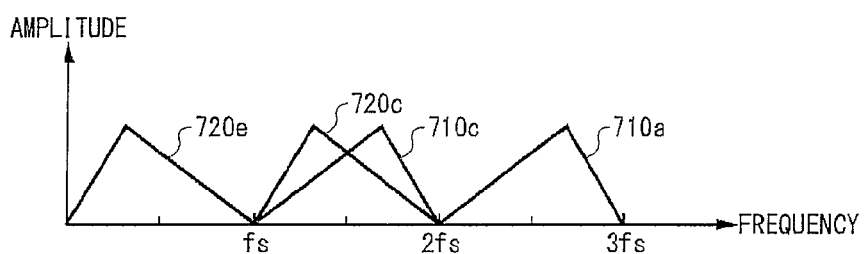
FIG. 7B shows a signal output from the sample processing section 115.
Figure 7C:
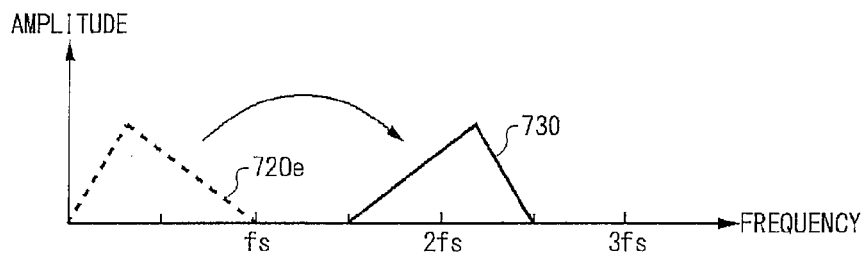
FIG. 7C shows a reproduction of the frequency component 730 of the signal under measurement based on the synthesized replica 720e.

FIG. 7A shows a signal under measurement input into the sample processing section 115 of the present embodiment. FIG. 7B shows a signal output from the sample processing section 115. FIG. 7C shows a reproduction of the frequency components 730 of the signal under measurement based on the synthesized replica 720e.

As shown in FIG. 6, with the signal under measurement 300 as a base, the replicas 510 that are shifted by an even integer multiple of the sampling repetition frequency (½)fs and the replicas 510 that are shifted by +3 times the sampling repetition frequency (½)fs cancel each other out. In this way, the signals under measurement 300 and the replicas 510 with frequencies centered on 0, 0.5fs, fs, 2fs, 3fs, and the like cancel each other out, as shown in FIG. 7B. On the other hand, the replicas 510 that are centered on 1.5fs, 2.5fs, and the like are added to each other instead of cancelling out, and so remain as the synthesized replicas 710a, 710c, and the like.

In the same way, the replicas 520 of the negative frequency component 310 of the signal under measurement 300 centered on 0, fs, 2fs, 2.5fs, 3fs, and the like cancel each other out. The replicas 520 that are centered on 1.5fs, 2.5fs, and the like are added to each other instead of cancelling out, and so remain as the synthesized replicas 720a, 720e, and the like. Accordingly, only the synthesized replica 720e remains in the frequency band from 0 to a frequency less than fs, which is the sampling band in the present embodiment.

In this way, the setting section 105 can set a plurality of non-uniform sampling phases for the clock control section 120 such that the replicas that are not observation targets cancel each other out, from among the replicas of the negative frequency component and the replicas of the signal under measurement in the observation band having a bandwidth less than that of the sampling band. The setting section 105 can also/instead set the inverting section 135 to invert the signs of the values of the signal under measurement sampled at least one of the plurality of sampling phases. Therefore, the clock control section 120 and the plurality of AD converters 125 can sample the signal under measurement with a plurality of different phases that cancel out the replicas in the sampling band that are not observation targets, from among the replicas of the negative frequency component and the replicas of the signal under measurement in the observation band having a bandwidth less than that of the sampling band. The inverting section 135 can cancel out the replicas that are not observation targets from among the replicas of the negative frequency component and the replicas of the signal under measurement in the sampling band by inverting the signs of the values of the signal under measurement sampled at least one of the plurality of sampling phases.

More specifically, if the replicas occur due to the signal under measurement or the negative frequency component being shifted by an integer multiple, such as a multiple of −3, of the sampling repetition frequency, the setting section 105 may set a plurality of sampling phases for the clock control section 120. The plurality of sampling phases includes a first sampling set such that the time corresponding to the aforementioned integer multiple of the phase difference is equal to a value obtained by adding ½ of a cycle to an integer multiple, including 0, of the sampling repetition cycle, and a second sampling phase that is different from the first sampling phase. These sampling phases may be 0 and 60 degrees respectively, for example. In order to cancel out the replicas caused by shifting the signal under measurement or the negative frequency component by an integer multiple, such as −3, of the sampling repetition frequency, the setting section 105 may first set a plurality of sampling phases for the clock control section 120. The plurality of sampling phases may include a first and second sampling phase of 0 and 120 degrees respectively, for example, that cause the aforementioned integer multiple of the phase difference to be a multiple of the sampling repetition cycle. The setting section 105 may then set the inverting section 135 to invert the signs of the values of the signal under measurement sampled at the second sampling phase of 120 degrees and to not invert the signs of the values of the signal under measurement sampled at the first sampling phase of 0 degrees.

The Fourier transform section 155 reads the sample data in the time domain having the frequency spectrum shown above from the storage section 140, and converts the sample data into the frequency domain. In this way, the Fourier transform section 155 obtains the sample data in the frequency domain shown by FIG. 7B.

The extracting section 160 performs a band pass or low pass filtering process to extract the target synthesized replica 720e in the sampling band from the sample data in the frequency domain. The frequency converting section 162 shifts the synthesized replica 720e by a frequency of 1.5fs to 2.5fs, which is the observation band. If the observation target is a replica of the negative frequency component 310 of the signal under measurement 300 as in the present embodiment, the frequency direction of the replica is inverted in relation to the original signal under measurement 300, as shown by the synthesized replica 720e in FIG. 7C. In this case, the extracting section 160 or the frequency converting section 162 may reproduce the frequency spectrum of the signal under measurement 300 by inverting the frequency direction of the synthesized replica 720e.

Since the synthesized replica 720e overlaps with a plurality of replicas that are frequency shifted in relation to the original frequency component 310, the size and phase of the synthesized replica 720e may be different from those of the original frequency component 310. For example, in the present embodiment, the four replicas 520e of the negative frequency component 310 corresponding to the first through fourth sampling phases have phases of 0, 300, 180, and 120 degrees, as shown in FIG. 6. These phases are obtained by shifting the replicas from the negative frequency component 310 by a frequency of 5 times the sampling repetition frequency (½)fs. When the first and second replicas 520e are added to each other and the third and fourth replicas 520e cancel each other out, the resulting synthesized replica 720e is 2√3 times larger than the negative frequency component 310 and has a phase that differs from that of the original frequency component 310 by 330 degrees, which is equivalent to −30%. Accordingly, the extracting section 160 or the frequency converting section 162 may adjust the size and phase of the synthesized replica 720e in addition to the frequency shift and frequency direction, in order to reproduce the signal under measurement 300.

The inverse Fourier transform section 165 obtains the waveform data of the signal under measurement in the time domain by inverse Fourier transforming the signal under measurement 300 reproduced in the frequency domain. Instead of adjusting the size and phase of the synthesized replica 710e using the extracting section 160 or the frequency converting section 162, the inverse Fourier transform section 165 may adjust the size and phase of the waveform data of the signal under measurement in the time domain.

As described above, the sampling apparatus 10 of the present embodiment samples the signal under measurement with a plurality of sampling phases at non-uniform intervals. The sampling apparatus 10 can then cancel out the replicas in the sampling band that are not observation targets, from among the replicas of the negative frequency component and the replicas of the signal under measurement in the observation band having a bandwidth that is less than the sampling bandwidth, by inverting the signs of the values of the signal under measurement sampled at least one of the plurality of sampling phases as necessary. The sampling apparatus 10 reproduces the waveform data of the signal under measurement based on the remaining target replicas.

Figure 8A:
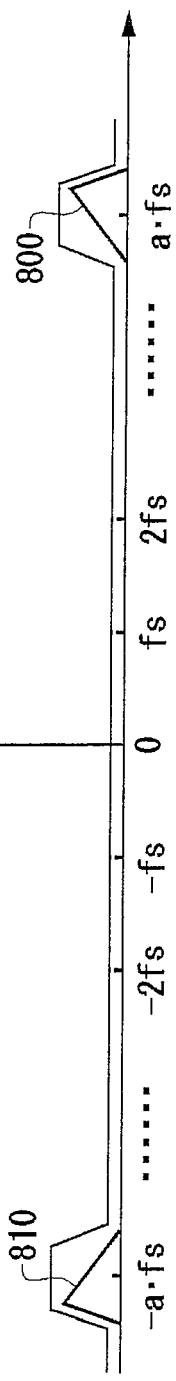
FIG. 8A shows another example of the signal under measurement input into the sample processing section 115 of the present embodiment.
Figure 8B:
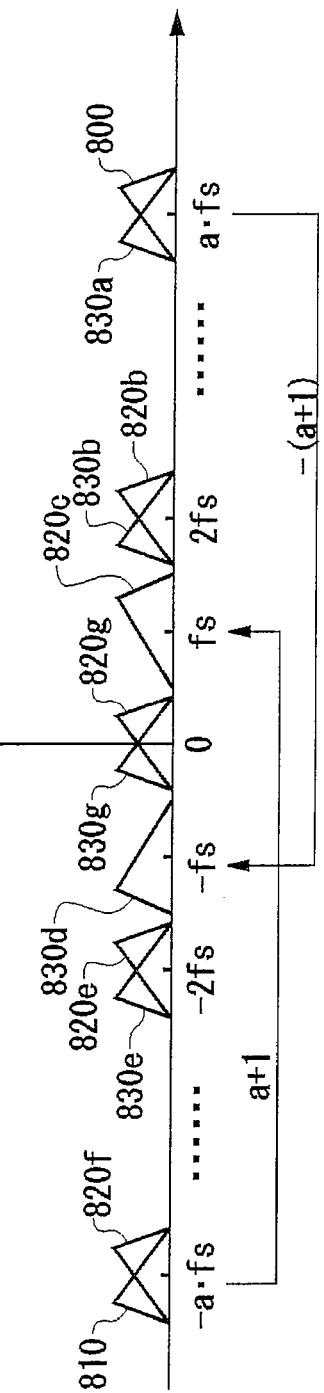
FIG. 8B shows another example of a signal output by the sample processing section 115 of the present embodiment.

FIG. 8A shows another example of the signal under measurement input into the sample processing section 115 of the present embodiment. FIG. 8B shows another example of a signal output by the sample processing section 115 of the present embodiment. A signal under measurement 800 of the present embodiment is positioned in an observation band having a bandwidth of 1·fs and centered on a frequency a·fs, where "a" is a natural number. The following describes an example in which the plurality of AD converters 125 sample the signal under measurement with a plurality of sampling phases chosen from among phases obtained by uniformly dividing the sampling repetition cycle into a number n of cycles that is larger than the number of sampling phases, which is 2 in the present embodiment.

In this example, the setting section 105 sets, for the clock control section 120, the plurality of sampling phases chosen from among the phases obtained by uniformly dividing the sampling repetition cycle into the number n of cycles that is larger than the number of sampling phases. More specifically, the setting section 105 sets the clock control section 120 to generate sampling clocks CLK1 and CLK2 respectively having a first sampling phase and a second sampling phase, which is delayed by (m/n)T in relation to the first sampling phase, for each sampling repetition cycle T, where T=1/fs. Here, m and n are coprime natural numbers. If m and n are not coprime, m and n can be set to be coprime by performing a fraction reduction of m and n and setting the resulting values to be m and n.

In this case, f(t) of the signal under measurement and the digital function δ(t) can be used in Expression 1, shown below, to calculate the sample data $g_1(t)$ sampled by the AD converter 125-1 at the first sampling phase and the sample data $g_2(t)$ sampled by the AD converter 125-2 at the second sampling phase.

$$g_1(t) = \sum_{k=-\infty}^{\infty} \delta(t - kT)f(t)$$

$$g_2(t) = \sum_{k=-\infty}^{\infty} \delta\left(t - kT - \frac{m}{n}T\right)f(t)$$

Expression 1

The sample data $g_1(t)$ and $g_2(t)$ of Expression 1 are Fourier transformed to obtain the sample data $G_1(\omega)$ and $G_2(\omega)$ in the frequency domain, as shown below in Expression 2.

$$G_1(\omega) = \frac{1}{T}\sum_{k=-\infty}^{\infty} F\left(\omega - \frac{2\pi k}{T}\right)$$

$$G_2(\omega) = \frac{1}{T}\sum_{k=-\infty}^{\infty} F\left(\omega - \frac{2\pi k}{T}\right)\exp\left(-j\frac{2\pi k}{T}\cdot\frac{m}{n}T\right)$$

Expression 2

To simplify this example, it is assumed that the multiplexer 130 and the inverting section 135 output a waveform, obtained by adding together $g_1(t)$ and $g_2(t)$, to the storage section 140. More specifically, the multiplexer 130 outputs the sample data from the AD converter 125-1 at the first sampling phase to the inverting section 135, outputs the sample data from the AD converter 125-2 at the second sampling phase to the inverting section 135, and outputs the constant 0 to the inverting section 135 at any other phases. The inverting section 135 outputs each value of the sample data without inverting the sign thereof.

The sample data in the frequency band, which is obtained from the Fourier transform section 155 Fourier transforming the sample data output by the sample processing section 115, is made up of values obtained by adding together $G_1(\omega)$ and $G_2(\omega)$. Specifically, the Fourier transform section 155 outputs the sample data of the frequency band as shown in Expression 3.

$$G_1(\omega) + G_2(\omega) = \frac{1}{T}\sum_{k=-\infty}^{\infty} F\left(\omega - \frac{2\pi k}{T}\right)\left(1 + \exp\left(-j\frac{2m\pi k}{n}\right)\right)$$

$$= \frac{2}{T}\sum_{k=-\infty}^{\infty} F\left(\omega - \frac{2\pi k}{T}\right)\cos\left(\frac{m\pi k}{n}\right)\exp\left(-j\frac{m\pi k}{n}\right)$$

Expression 3

Expression 3 shows that, if cos(mπk/n) is equal to 0, $G_1(\omega)$ and $G_2(\omega)$ cancel out, so that the frequency band obtained as a summation of $G_1(\omega)$ and $G_2(\omega)$ is equal to 0. Here, the (a+1)th replicas of the negative frequency component 810 should be set to cancel out, so that the replicas of the negative frequency component 810 of the signal under measurement 800 cancel out in the sampling band having a bandwidth of 1·fs and centered on the frequency fs. To achieve this, k should be equal to a+1 and cos(mπ(a+1)/n) should equal 0.

Here, when n is set equal to 2(a+1), mπ(a+1)/n=min(a+1)/{2(a+1)}=mπ/2. Since m and n are coprime and n is an even number, m is an odd number, and therefore cos(mπ/2)=0. Accordingly, if m is set to an odd number such as 1 and n is set to 2(a+1), the replicas 830 of the negative frequency component 810 in the sampling band centered on the frequency fs cancel out. Therefore, the waveform generating section 150 can extract the replica 820c of the signal under measurement 800 to generate the waveform data of the signal under measurement.

As described above, if the signal under measurement centered on a frequency that is "a" times the sampling repetition frequency is shifted to a lower frequency by (a−1) times the sampling repetition frequency and the target replica is in the sampling band centered on the sampling repetition frequency, two sampling phases should be used that are separated by the odd number m, from among the phases obtained by dividing the sampling repetition cycle by n=2(a+1). In other words, these two sampling phases should have a phase difference of m/2(a+1)T. In the same way, if the negative frequency component of the signal under measurement centered on a frequency that is "a" times the sampling repetition frequency is shifted to a higher frequency by (a+1) times the sampling repetition frequency and the target replica is based on the negative frequency component and in the sampling band centered on the sampling repetition frequency, two sampling phases should be used that are separated by the odd number m, from among the phases obtained by dividing the sampling repetition cycle by n=2(a−1). In other words, these two sampling phases should have a phase difference of m/2(a−1)T.

The setting section 105 can set the values of m and n such that the replicas that are not observation targets cancel out to leave only the target replicas in the sampling band that are obtained by shifting the signal under measurement in the observation band by any integer multiple of the sampling repetition frequency. More specifically, to cancel out the replicas obtained by shifting the signal under measurement or the negative frequency component by x times the sampling repetition frequency, the setting section 105 sets n equal to 2× and m equal to an odd number, for example. It should be noted that x must be greater than or equal to 2 to achieve sampling at non-uniform intervals.

In order to cancel out the replicas in the sampling band that occur when the signal under measurement 800 or the negative frequency component 810 is shifted by an integer multiple of the sampling repetition frequency, the setting section 105 may invert the signs of the values of the signal under measurement sampled at least one of the sampling phases as necessary. By inverting the signs of the values of the signal under measurement, the setting section 105 can rotate the phase of the replicas in the sampling band by 180 degrees.

Even if three or more sampling phases are used, the setting section 105 can cancel out unnecessary replicas in the sampling band, set three or more sampling phases that are suitable for allowing the target replicas to remain in the sampling band, and invert the signs of sample data corresponding to one or more phases as necessary, in the same manner as described above.

If m is an even number, the coprime n must be an odd number. In this case, $\cos(m\pi k/n)$ can not be equal to 0. Accordingly, if n is an odd number, the replicas do not cancel out. Even if n is an odd number, however, the sampling apparatus 10 according to the present embodiment can still be realized as long as the value of n is large enough that $\cos(m\pi k/n)$ can be treated as being equal to 0.

As described above, the sampling apparatus 10 of the present embodiment can set the plurality of sampling phases at non-uniform intervals according to the observation band, cancel out replicas in the sampling band that are not observation targets by inverting the signs of the sample data corresponding to at least one of the sampling phases as necessary, and extract the target replicas to reproduce the waveform data of the signal under measurement.

Figure 9:
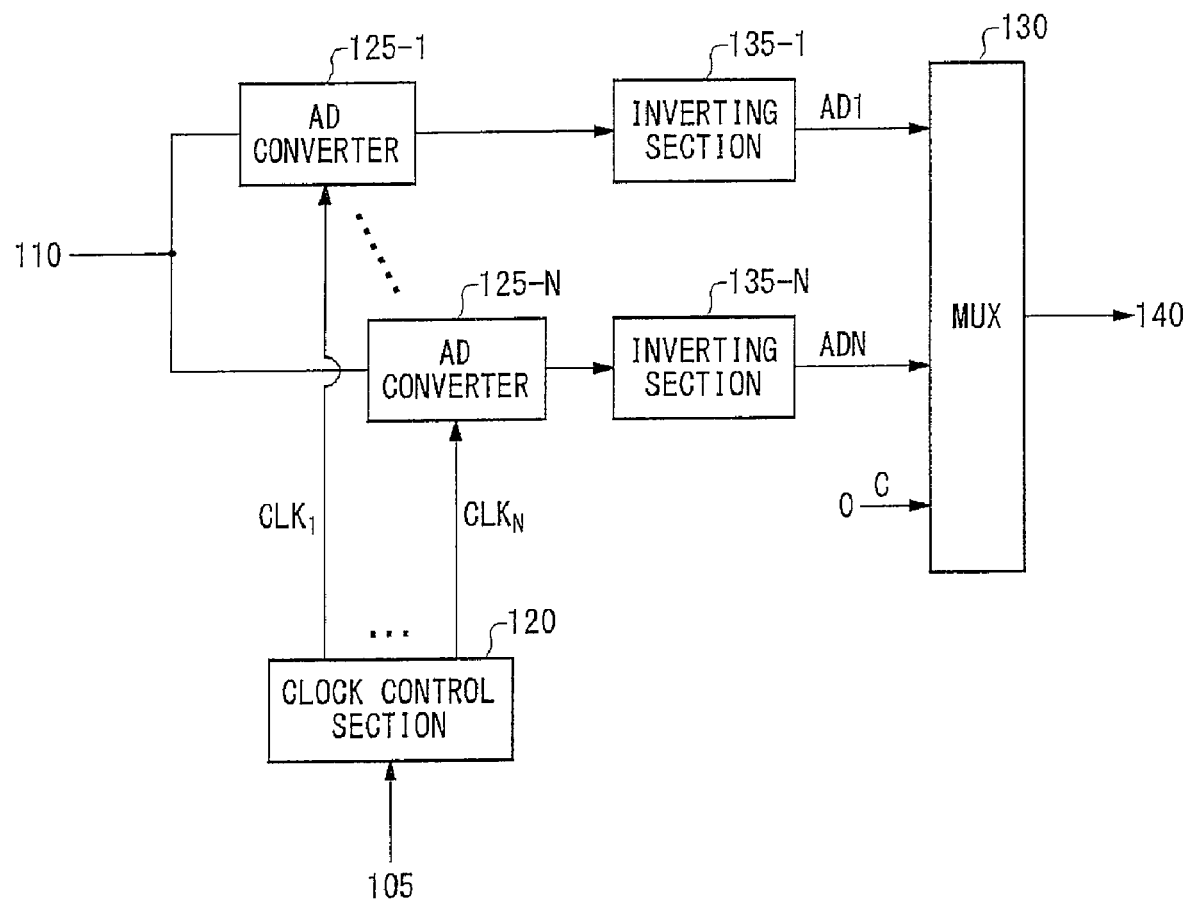
FIG. 9 shows a configuration of the sample processing section 115 according to a first modification of the present embodiment.

FIG. 9 shows a configuration of the sample processing section 115 according to a first modification of the present embodiment. The sample processing section 115 of the present modification adopts almost the same function and configuration as the sample processing section 115 shown in FIG. 1, and therefore components having substantially the same configuration and function as components of the sample processing section 115 of FIG. 1 are given the same reference numbers and the following description omits all but differing points.

Instead of one inverting section 135 disposed behind the multiplexer 130, as shown in FIG. 1, the sample processing section 115 according to the present modification has a plurality of inverting sections 135-1 to 135-N disposed to correspond to a plurality of AD converters 125-1 to 125-N. The plurality of inverting sections 135-1 to 135-N are provided between the plurality of AD converters 125-1 to 125-N and the multiplexer 130. Each of the plurality of inverting sections 135-1 to 135-N receives a setting from the setting section 105 to invert the signs of the sample data values of the signal under measurement sampled by the corresponding AD converter 125 as necessary.

Each of the plurality of inverting sections 135-1 to 135-N may invert the sign of the sample data output by the corresponding AD converter 125 to be negative in every other sample. More specifically, each of the plurality of inverting sections 135-1 to 135-N may output the sample data output by the corresponding AD converter 125 in a certain cycle of the sampling clock without inversion, and then invert the sign of the sample data in the subsequent cycle and output the inverted sample data.

In the present modification, the multiplexer 130 switches between selecting the constant 0 and the sample data from the plurality of inverting sections 135-1 to 135-N. In this way, the multiplexer 130 multiplexes the data and outputs the multiplexed sample data to the storage section 140. The sample processing section 115 of the present modification can output the sample data in which the replicas in the sampling band that are not observation targets cancel out, in the same way as the sample processing section 115 of FIG. 1.

Figure 10:
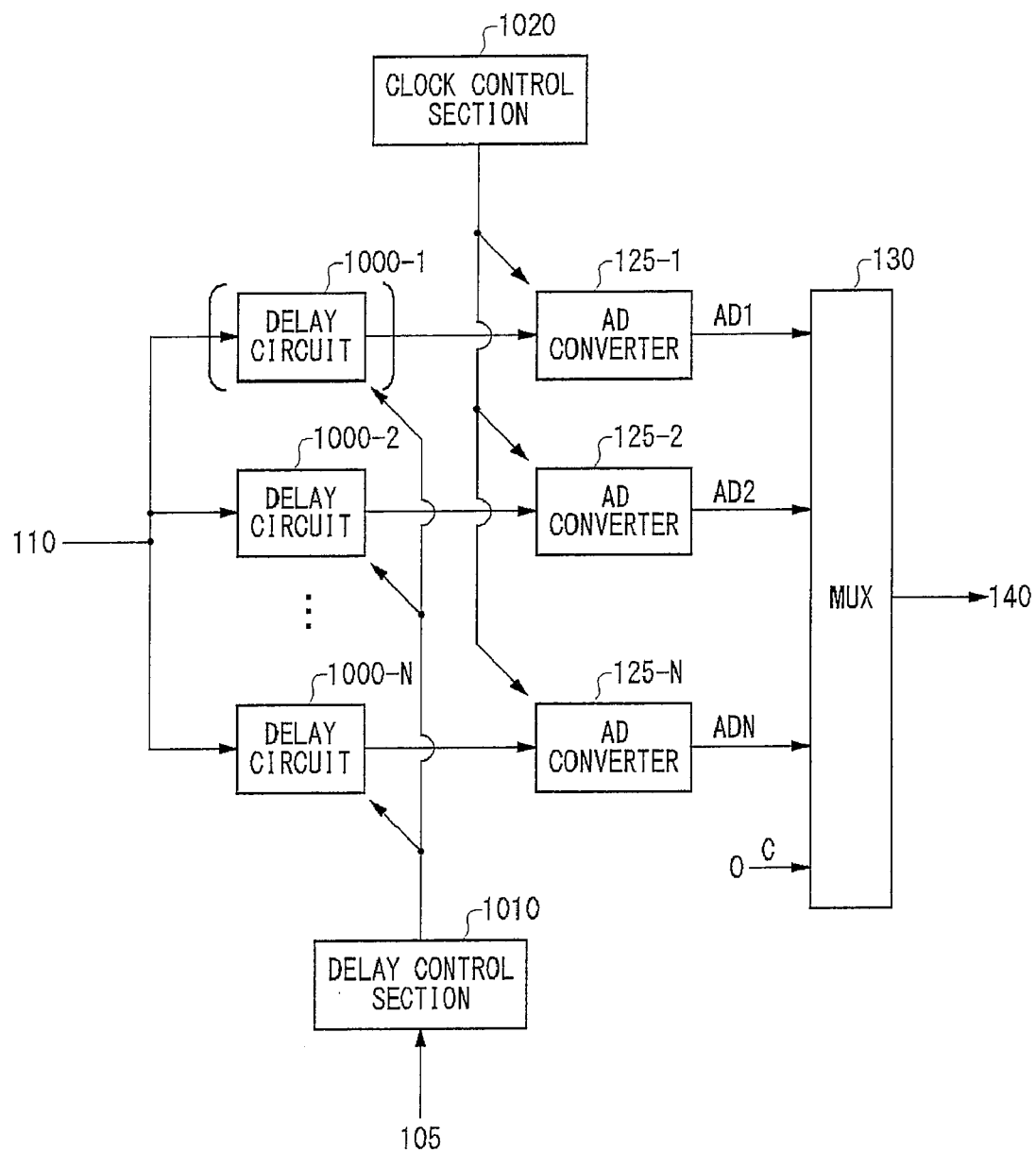
FIG. 10 shows a configuration of the sample processing section 115 according to a second modification of the present embodiment.

FIG. 10 shows a configuration of the sample processing section 115 according to a second modification of the present embodiment. The sample processing section 115 according to the present modification adopts almost the same function and configuration as the sample processing section 115 shown in FIG. 1, and therefore components having substantially the same configuration and function as components of the sample processing section 115 of FIG. 1 are given the same reference numbers and the following description omits all but differing points.

Instead of the clock control section 120 shown in FIG. 1, the sample processing section 115 of the present modification has a plurality of delay circuits 1000-1 to 1000-N, a delay control section 1010, and a clock control section 1020. Each of the plurality of delay circuits 1000-1 to 1000-N is disposed to correspond to one of the plurality of AD converters 125-1 to 125-N. The plurality of delay circuits 1000-1 to 1000-N are controlled by the delay control section 1010 to delay the signal under measurement by an amount corresponding to each of the plurality of sampling phases. Each of the plurality of delay circuits 1000-1 to 1000-N supplies the thus delayed signal under measurement to the corresponding AD converter 125-1 to 125-N.

The delay control section 1010 receives a setting from the setting section 105 to set the delay amounts of the plurality of delay circuits 1000-1 to 1000-N to delay the signal under measurement by delay amounts corresponding to the plurality of sampling phases at non-uniform intervals, in relation to the sampling repetition cycle. More specifically, the delay control section 1010 sets the delay amounts of the plurality of delay circuits 1000-1 to 1000-N such that each delay circuit 1000-1 to 1000-N delays the signal under measurement by an amount corresponding to the sampling phase in relation to the sampling repetition cycle of the corresponding AD converter 125.

The delay control section 1010 may instead set the plurality of delay circuits 1000-1 to 1000-N such that each delay circuit 1000-1 to 1000-N delays the signal under measurement by an amount corresponding to the phase difference between a reference phase in relation to the sampling repetition phase and a sampling phase in relation to the sampling repetition cycle of the corresponding AD converter 125. In this case, the delay circuit 1000-1 to 1000-N that corresponds to the AD converter 125 having the earliest sampling phase can be omitted from the configuration of the sample processing section 115 if the reference phase in relation to the sampling repetition cycle is set as the earliest sampling phase from among the plurality of sampling phases.

The clock control section 1020 provides the plurality of AD converters 125-1 to 125-N with reference clocks having the same phase. The clock control section 1020 may provide the plurality of AD converters 125-1 to 125-N with reference clocks having identical phases and cycles equal to the sampling process repletion cycle.

The plurality of AD converters 125-1 to 125-N sample the signal under measurement delayed by the plurality of delay circuits 1000-1 to 1000-N according to the reference clock. Each of the plurality of AD converters 125-1 to 125-N may sample the signal under measurement delayed by the corresponding delay circuit 1000-1 to 1000-N with one of the reference clocks having identical phases and cycles equal to the sampling repetition cycle. The sample processing section 115 according to the present modification can output sample data in which the replicas in the sampling band that are not observation targets cancel out, in the same way as the sample processing section 115 shown in FIG. 1.

Figure 11:
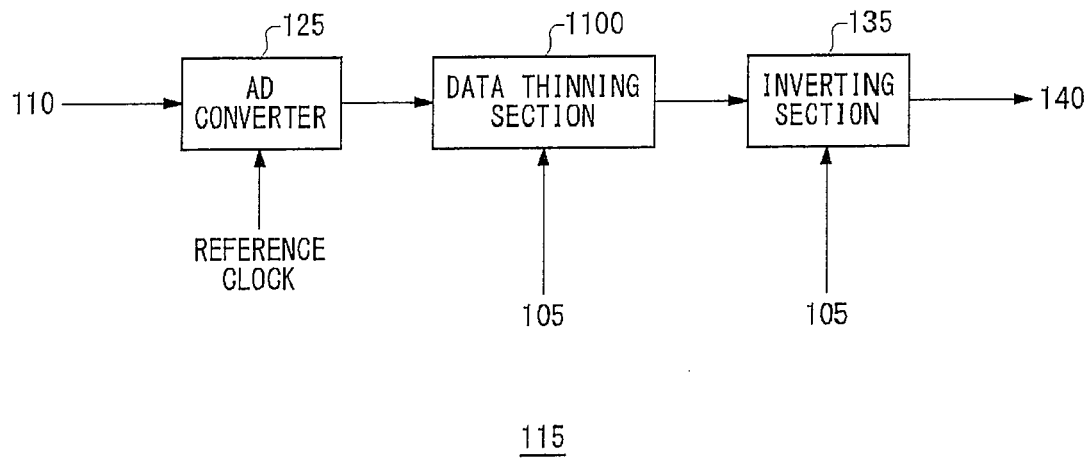
FIG. 11 shows a configuration of the sample processing section 115 according to a third modification of the present embodiment.

FIG. 11 shows a configuration of the sample processing section 115 according to a third modification of the present embodiment. The sample processing section 115 according to the present modification adopts almost the same function and configuration as the sample processing section 115 shown in FIG. 1, and therefore components having substantially the same configuration and function as components of the sample processing section 115 of FIG. 1 are given the same reference numbers and the following description omits all but differing points.

The sample processing section 115 according to the present modification outputs the sample data obtained by sampling the signal under measurement at sampling timings at non-uniform intervals obtained by thinning the reference clock. The sample processing section 115 of the present modification includes the AD converter 125, a data thinning section 1100, and the inverting section 135.

The AD converter 125 samples the signal under measurement in synchronization with the reference clock. The data thinning section 1100 thins the sample data output by the AD converter 125 according to the setting from the setting section 105, and outputs the sample data at the sampling timings at non-uniform intervals. The data thinning section 1100 supplies the thinned sample data to the inverting section 135.

In the present modification, the setting section 105 sets, for the data thinning section 1100 in the sample processing section 115, a sampling timing in the sampling repetition cycle, which is an integer multiple of the reference clock, based on the observation band of the signal under measurement. The setting section 105 may set, for the data thinning section 1100 in the sample processing section 115, a sampling timing of the data that remains in the sampling repetition cycle.

The setting section 105 sets, for the data thinning section 1100 in the sample processing section 115, the sampling timing in the sampling repetition cycle such that the positional relationship between the sampling repetition cycle and the designated reference clock is identical to the positional relationship between the sampling repetition cycle and the designated reference clock in the sample processing section 115 shown in FIG. 1. More specifically, the setting section 105 sets, for the data thinning section 1100 in the sample processing section 115, a sampling timing at determined non-uniform intervals such that one of the replicas of the signal under measurement in the observation band and the replicas of the negative frequency component of the signal under measurement in the observation band remain, and that all other replicas in the sampling band cancel out.

The setting section 105 may set, for the data thinning section 1100 in the sample processing section 115, a plurality of reference clock phases selected from among the phases obtained by uniformly dividing the sampling repetition cycle into a number n of cycles that is larger than the number of reference clock phases. More specifically, the setting section 105 may set the data thinning section 1100 such that the sample data of the first reference clock phase and sample data of the second reference clock phase, which is delayed by $(m/n)T$ in relation to the phase of the first reference clock, remain in each sampling repetition cycle T, where $T=1/fs$. Here, m and n are set to be coprime natural numbers. If m and n are not coprime, m and n can be set to be coprime by performing a fraction reduction of m and n and setting the resulting values to be m and n. Furthermore, the setting section 105 may set the inverting section 135 to output the values of the sample data without inverting the signs.

The sample processing section 115 of the present modification can output the sample data in which the replicas in the sampling band that are not observation targets cancel out. The sample processing section 115 of the present modification can decrease the necessary storage capacity and the data transmission amount in the final stage of the data processing by thinning the sample data output by the AD converter 125 to be the data rate necessary for reproducing the signal under measurement in the observation band. In this way, the sample processing section 115 of the present modification can be implemented to reduce the size of the circuit connected at the final stage.

Figure 12:
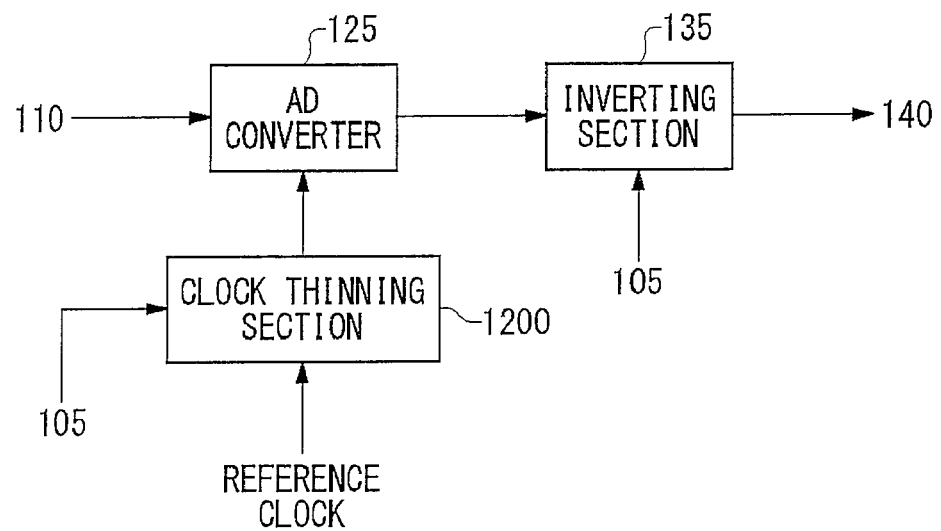
FIG. 12 shows a configuration of the sample processing section 115 according to a fourth modification of the present embodiment.

FIG. 12 shows a configuration of the sample processing section 115 according to a fourth modification of the present embodiment. The sample processing section 115 according to the present modification adopts almost the same function and configuration as the sample processing section 115 shown in FIG. 11, and therefore components having substantially the same configuration and function as components of the sample processing section 115 of FIG. 11 are given the same reference numbers and the following description omits all but differing points.

Instead of the data thinning section 1100 shown in FIG. 11, the sample processing section 115 of the present modification has a clock thinning section 1200 in the sample processing section 115. The sample processing section 115 of the present modification outputs the sample data obtained by sampling the signal under measurement at sampling timings at non-uniform intervals obtained by thinning the reference clock, in the same manner as the sample processing section 115 shown in FIG. 11.

The clock thinning section 1200 thins the reference clock according to the setting from the setting section 105 to output a sampling clock with non-uniform intervals. The AD converter 125 outputs sample data obtained by sampling the signal under measurement in synchronization with the sampling clock supplied from the clock thinning section 1200. The AD converter 125 outputs the sample data to the inverting section 135.

The setting section 105 of the present modification sets the clock thinning section 1200 in the same way as the data thinning section 1100 shown in FIG. 11. In other words, the setting section 105 sets, for the clock thinning section 1200 in the sample processing section 115, the sampling timing in the sampling repetition cycle that is an integer multiple of the cycle of the reference clock, based on the observation band of the signal under measurement.

The sample processing section 115 of the present modification can output the sample data in which the replicas in the sampling band that are not observation targets cancel out, in the same way as the sample processing section 115 shown in FIG. 11. The sample processing section 115 of the present modification can decrease the necessary storage capacity and the data transmission amount in the final stage of the data processing, thereby reducing the size of the circuit connected at the final stage.

While the embodiments of the present invention has have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

For example, instead of including the Fourier transform section 155, the extracting section 160, the frequency converting section 162, and the inverse Fourier transform section 165, the waveform generating section 150 may include a low pass filter that allows a frequency component that is less than or equal to a preset frequency to pass through, from among the sample data read from the storage section 140. In this way, the waveform generating section 150 can output waveform data in the frequency band obtained by frequency converting the signal under measurement in the observation band. The waveform generating section 150 may include a multiplier that multiplies the waveform data output from the low pass filter by sine wave data. The sine wave data may have a frequency equal to the frequency of the observation band plus or minus the frequency of the sampling band. In this way, the waveform generating section 150 can reproduce the signal tinder measurement by frequency converting the waveform data in the sampling band output by the low pass filter into waveform data in the observation band.

The sample processing section 115 may be provided with a sample/hold circuit or a track/hold circuit at a stage prior to each of the plurality of sample processing sections 115. In this way, the sample processing section 115 can more accurately sample the signal under measurement.

Figure 13:
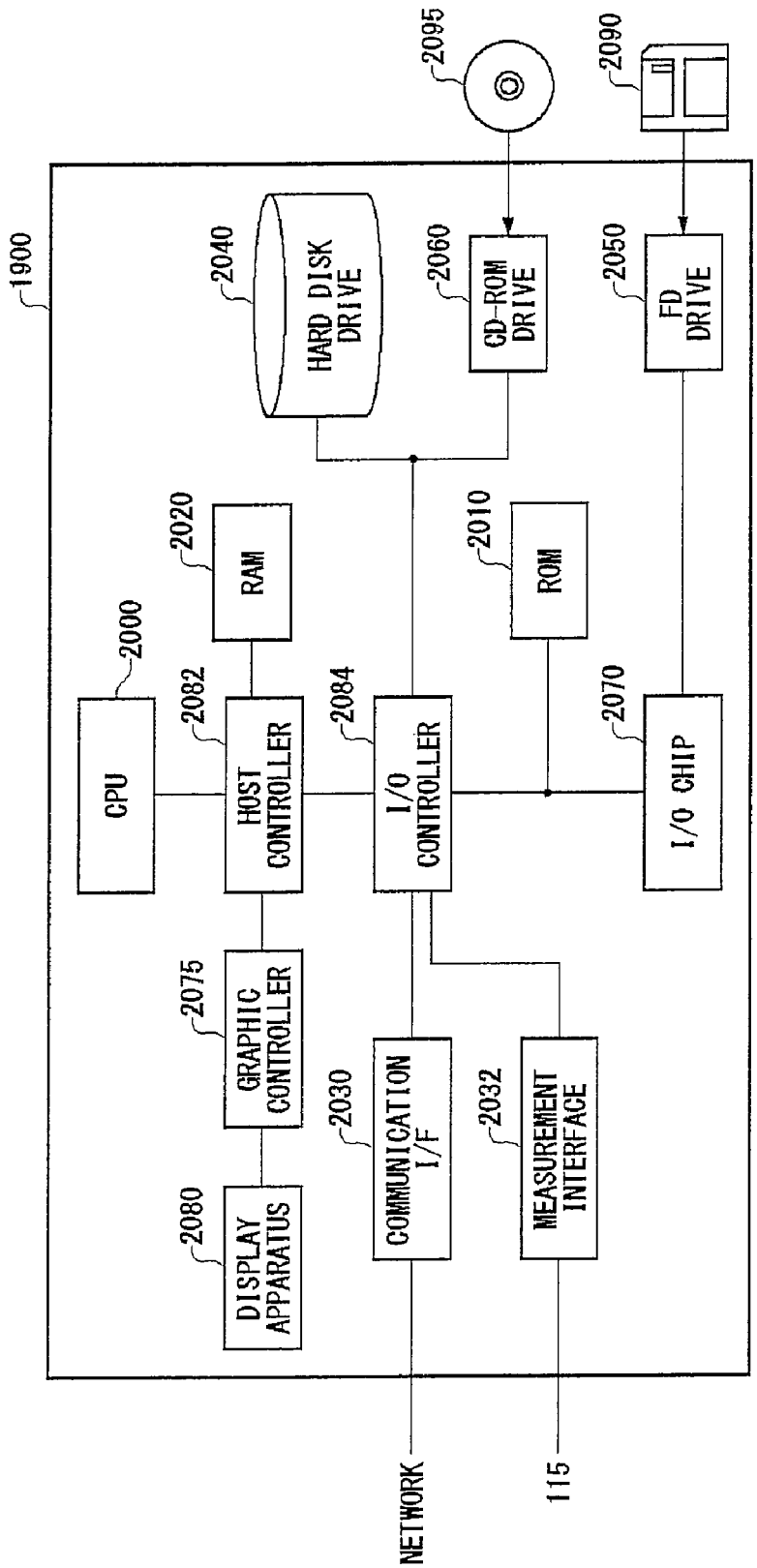
FIG. 13 shows an example of a hardware configuration of a computer 1900 according to the present embodiment.

FIG. 13 shows an example of a hardware configuration of a computer 1900 according to the present embodiment. The computer 1900 according to the present embodiment is provided with a CPU peripheral including a CPU 2000, a RAM 2020, a graphic controller 2075, and a display apparatus 2080, all of which are connected to each other by a host controller 2082; an input/output section including a communication interface 2030, a measurement interface 2032, a hard disk drive 2040, and a CD-ROM drive 2060, all of which are connected to the host controller 2082 by an input/output controller 2084; and a legacy input/output section including a ROM 2010, a flexible disk drive 2050, and an input/output chip 2070, all of which are connected to the input/output controller 2084.

The host controller 2082 is connected to the RAM 2020 and is also connected to the CPU 2000 and graphic controller 2075 accessing the RAM 2020 at a high transfer rate. The CPU 2000 operates to control each section based on programs stored in the ROM 2010 and the RAM 2020. The graphic controller 2075 acquires image data generated by the CPU 2000 or the like on a frame buffer disposed inside the RAM 2020 and displays the image data in the display apparatus 2080. In addition, the graphic controller 2075 may internally include the frame buffer storing the image data generated by the CPU 2000 or the like.

The input/output controller 2084 connects the communication interface 2030 serving as a relatively high speed input/output apparatus, and the hard disk drive 2040, and the CD-ROM drive 2060 to the host controller 2082. The communication interface 2030 communicates with other apparatuses via a network.

The measurement interface 2032 communicates with the sample processing section 115 of the present embodiment. The measurement interface 2032 supplies setting data and control data to the sample processing section 115, and acquires sample data sampled by the sample processing section 115. The measurement interface 2032 may communicate with the band limiting section 110 of the present embodiment to set the passable frequency band for the band limiting section 110.

The hard disk drive 2040 stores the programs and data used by the CPU 2000 housed in the computer 1900. The CD-ROM drive 2060 reads the programs and data from a CD-ROM 2095 and provides the read information to the hard disk drive 2040 via the RAM 2020.

Furthermore, the input/output controller 2084 is connected to the ROM 2010, and is also connected to the flexible disk drive 2050 and the input/output chip 2070 serving as a relatively high speed input/output apparatus. The ROM 2010 stores a boot program performed when the computer 1900 starts up, a program relying on the hardware of the computer 1900, and the like. The flexible disk drive 2050 reads programs or data from a flexible disk 2090 and supplies the read information to the hard disk drive 2040 via the RAM 2020. The input/output chip 2070 connects the flexible disk drive 2050 to the input/output controller 2084 along with each of the input/output apparatuses via, a parallel port, a serial port, a keyboard port, a mouse port, or the like.

The programs provided to the hard disk drive 2040 via the RAM 2020 are stored in a storage medium, such as the flexible disk 2090, the CD-ROM 2095, or an IC card, and provided by a user. The programs are read from storage medium, installed in the hard disk drive 2040 inside the computer 1900 via the RAM 2020, and performed by the CPU 2000.

The programs installed in the computer 1900 to make the computer 1900 function as a portion of the sampling apparatus 10 are provided with an input module, a setting module, a storage module, and a waveform generating module. These programs and modules prompt the CPU 2000 or the like to make the computer 1900 function as the input section 100, the setting section 105, the storage section 140, and the waveform generating section 150, respectively.

The information processes recorded in these programs are read by the computer 1900 to cause the computer 1900 to function as software and hardware described above, which are exemplified by the specific sections of the input section 100, the setting section 105, the storage section 140, and the waveform generating section 150. With these specific sections, a unique sampling apparatus 10 suitable for an intended use can be configured to function along with the band limiting section 110 and the sample processing section 115 by realizing the calculations or computations appropriate for the intended use of the computer 1900 of the present embodiment.

For example, if there is communication between the computer 1900 and an external apparatus or the like, the CPU 2000 performs the communication program loaded in the RAM 2020, and provides the communication interface 2030 with communication processing instructions based on the content of the process recorded in the communication program. The communication interface 2030 is controlled by the CPU 2000 to read the transmission data stored in the transmission buffer area or the like on the storage apparatus, such as the RAM 2020, the hard disc 2040, the flexible disk 2090, or the CD-ROM 2095, and send this transmission data to the network, and to write data received from the network onto a reception buffer area on the storage apparatus. In this way, the communication interface 2030 may transmit data to and from the storage apparatus through DMA (Direct Memory Access). As another possibility, the CPU 2000 may transmit the data by reading the data from the storage apparatus or communication interface 2030 that are the origins of the transmitted data, and writing the data onto the communication interface 2030 or the storage apparatus that are the transmission destinations.

The CPU 2000 may perform various processes on the data in the RAM 2020 by reading into the RAM 2020, through DMA transmission or the like, all or a necessary portion of the database or files stored in the external apparatus such as the hard disk 2040, the CD-ROM drive 2060, the CD-ROM 2095, the flexible disk drive 2050, or the flexible disk 2090. The CPU 2000 writes the processed data back to the external apparatus through DMA transmission or the like. In this process, the RAM 2020 is considered to be a section that temporarily stores the content of the external storage apparatus, and therefore the RAM 2020, the external apparatus, and the like in the present embodiment are referred to as a memory, a storage section, and a storage apparatus. The variety of information in the present embodiment, such as the variety of programs, data, tables, databases, and the like are stored on the storage apparatus to become the target of the information processing. The CPU 2000 can hold a portion of the RAM 2020 in a cache memory and read from or write to the cache memory. With such a configuration as well, the cache memory serves part of the function of the RAM 2020, and therefore the cache memory is also included with the RAM 2020, the memory, and/or the storage apparatus in the present invention, except when a distinction is made.

The CPU 2000 executes the various processes such as the computation, information processing, condition judgment, searching for/replacing information, and the like included in the present embodiment for the data read from the RAM 2020, as designated by the command sequence of the program, and writes the result back onto the RAM 2020. For example, when performing condition judgment, the CPU 2000 judges whether a variable of any type shown in the present embodiment fulfills a condition of being greater than, less than, no greater than, no less than, or equal to another variable or constant. If the condition is fulfilled, or unfulfilled, depending on the circumstances, the CPU 2000 branches into a different command sequence or acquires a subroutine.

The CPU 2000 can search for information stored in a file in the storage apparatus, the database, and the like. For example, if a plurality of entries associated respectively with a first type of value and a second type of value are stored in the storage apparatus, the CPU 2000 can search for entries fulfilling a condition designated by the first type of value from among the plurality of entries stored in the storage apparatus. The CPU 2000 can then obtain the second type of value associated with the first type of value fulfilling the prescribed condition by reading the second type of value stored at the same entry.

The programs and modules shown above may also be stored in an external storage medium. The flexible disk 2090, the CD-ROM 2095, an optical storage medium such as a DVD or CD, a magneto-optical storage medium, a tape medium, a semiconductor memory such as an IC card, or the like can be used as the storage medium. Furthermore, a storage apparatus such as a hard disk or RAM that is provided with a server system connected to the Internet or a specialized communication network may be used to provide the programs to the computer 1900 via the network.

What is claimed is:

1. A sampling apparatus that samples a signal under measurement, comprising:
    a sample processing section that outputs sample data obtained by sampling the signal under measurement with a sampling timing at non-uniform intervals obtained by thinning a reference clock;
    a storage section that stores the sample data; and
    a waveform generating section that generates a waveform of the signal under measurement based on the sample data read from the storage section, wherein
    the sample processing section includes:
        a sampler that samples the signal under measurement in synchronization with the reference clock; and
        a data thinning section that thins the sample data output by the sampler and outputs the thinned data as sample data with the sampling timing at non-uniform intervals.

2. A sampling apparatus that samples a signal under measurement, comprising:
    a sample processing section that outputs sample data obtained by sampling the signal under measurement with a sampling timing at non-uniform intervals obtained by thinning a reference clock;
    a storage section that stores the sample data; and
    a waveform generating section that generates a waveform of the signal under measurement based on the sample data read from the storage section, wherein
    the sample processing section includes:
        a clock thinning section that outputs a sampling clock at non-uniform intervals obtained by thinning the reference clock; and
        a sampler that samples the signal under measurement in synchronization with the sampling clock to output the sample data.

3. The sampling apparatus according to claim 1 or 2, further comprising a setting section that sets, for the sample processing section, a sampling timing in a sampling repetition cycle that is an integer multiple of the reference clock.

4. The sampling apparatus according to claim 3, wherein the setting section sets, for the sample processing section, a sampling timing in the sampling repetition cycle based on an observation band of the signal under measurement.

5. The sampling apparatus according to claim 4, wherein the setting section sets, for the sample processing section, a sampling timing at determined non-uniform intervals, such that at least one of a replica in the sampling band of the signal under measurement in the observation band and a replica in the sampling band of a negative frequency component of the signal under measurement in the observation band remain, and that all other replicas in the sampling band of the signal under measurement and the sampling band of the negative frequency component cancel out.

6. The sampling apparatus according to claim 5, wherein the waveform generating section includes:
    a Fourier transform section that Fourier transforms the sample data read from the storage section into the frequency domain;
    a extracting section that extracts the target replica in the frequency domain;
    a frequency converting section that generates the signal under measurement in the frequency domain based on the target replica in the frequency domain; and
    an inverse Fourier transform section that generates waveform data of the signal under measurement in the time domain by inverse Fourier transforming the signal under measurement generated in the frequency domain.

7. A method for sampling a signal under measurement using a sampling apparatus, the method comprising:
    sampling the signal under measurement in synchronization with a reference clock;
    thinning the sample data and outputting the thinned data as sample data with the sampling timing at non-uniform intervals;
    storing the output sample data in a storage section of the sampling apparatus; and
    generating a waveform of the signal under measurement based on the thinned sample data read from the storage section.

8. The method according to claim 7, further comprising the step of setting a sampling timing in a sampling repetition cycle that is an integer multiple of the reference clock.

9. The method according to claim 8, wherein the step of setting the sampling timing comprises setting the sampling timing in the sampling repetition cycle based on an observation band of the signal under measurement.

10. The method according to claim 9, wherein the step of setting the sampling timing comprises setting the sampling timing at determined non-uniform intervals, such that at least one of a replica in the sampling band of the signal under measurement in the observation band and a replica in the sampling band of a negative frequency component of the signal under measurement in the observational band remain, and that all other replicas in the sampling band of the signal under measurement and the sampling band of the negative frequency component cancel out.

11. The method according to claim 10 wherein the step of generating the waveform includes:
Fourier transforming the sample data read from the storage section into the frequency domain;
extracting the target replica in the frequency domain;
generating the signal under measurement in the frequency domain based on the target replica in the frequency domain; and
generating waveform data of the signal under measurement in the time domain by inverse Fourier transforming the signal under measurement generated in the frequency domain.

12. A method for sampling a signal under measurement using a sampling apparatus, the method comprising:
outputting, using a sample processing section of the sampling apparatus, a sampling clock at non-uniform intervals obtained by thinning a reference clock;
sampling, using the sample processing section, the signal under measurement in synchronization with the sampling clock to output sample data with a sampling timing at non-uniform intervals;
storing the output sample data in a storage section of the sample processing section; and
generating, using a waveform generating section of the sampling apparatus, a waveform of the signal under measurement based on the sample data read from the storage section.

13. The method according to claim 12, further comprising the step of setting a sampling timing in a sampling repetition cycle that is an integer multiple of the reference clock.

14. The method according to claim 13, wherein the step of setting the sampling timing comprises setting the sampling timing in the sampling repetition cycle based on an observation band of the signal under measurement.

15. The method according to claim 14, wherein the step of setting the sampling timing comprises setting the sampling timing at determined non-uniform intervals, such that at least one of a replica in the sampling band of the signal under measurement in the observation band and a replica in the sampling band of a negative frequency component of the signal under measurement in the observational band remain, and that all other replicas in the sampling band of the signal under measurement and the sampling band of the negative frequency component cancel out.

16. The method according to claim 15 wherein the step of generating the waveform includes:
Fourier transforming the sample data read from the storage section into the frequency domain;
extracting the target replica in the frequency domain;
generating the signal under measurement in the frequency domain based on the target replica in the frequency domain; and
generating waveform data of the signal under measurement in the time domain by inverse Fourier transforming the signal under measurement generated in the frequency domain.

17. A sampling apparatus that samples a signal under measurement, comprising:
a sample processing section that outputs sample data obtained by sampling the signal under measurement with a sampling timing at non-uniform intervals obtained by thinning a reference clock;
a storage section that stores the sample data;
a waveform generating section that generates a waveform of the signal under measurement based on the sample data read from the storage section; and
a setting section that sets, for the sample processing section, a sampling timing in a sampling repetition cycle that is an integer multiple of the reference clock, based on an observation band of the signal under measurement, such that at least one of a replica in the sampling band of the signal under measurement in the observation band and a replica in the sampling band of a negative frequency component of the signal under measurement in the observation band remain, and that all other replicas in the sampling band of the signal under measurement and the sampling band of the negative frequency component cancel out.

18. The sampling apparatus according to claim 17, wherein the sample processing section includes:
a clock thinning section that outputs a sampling clock at non-uniform intervals obtained by thinning the reference clock; and
a sampler that samples the signal under measurement in synchronization with the sampling clock to output the sample data.

19. The sampling apparatus according to claim 17, wherein the waveform generating section includes:
a Fourier transform section that Fourier transforms the sample data read from the storage section into the frequency domain;
an extracting section that extracts the target replica in the frequency domain;
a frequency converting section that generates the signal under measurement in the frequency domain based on the target replica in the frequency domain; and
an inverse Fourier transform section that generates waveform data of the signal under measurement in the time domain by inverse Fourier transforming the signal under measurement generated in the frequency domain.

* * * * *